(12) United States Patent
Sudhakaran

(10) Patent No.: US 10,901,017 B2
(45) Date of Patent: Jan. 26, 2021

(54) SYSTEMATIC METHODOLOGY TO REMOVE REFLECTIONS FROM I/O MEASUREMENTS

(71) Applicant: NVIDIA CORPORATION, Santa Clara, CA (US)

(72) Inventor: Sunil Sudhakaran, San Francisco, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 556 days.

(21) Appl. No.: 15/673,302

(22) Filed: Aug. 9, 2017

(65) Prior Publication Data

US 2019/0049496 A1 Feb. 14, 2019

(51) Int. Cl.
| | |
|---|---|
| G01R 23/167 | (2006.01) |
| G06F 17/12 | (2006.01) |
| G01R 31/28 | (2006.01) |
| G01R 29/26 | (2006.01) |

(52) U.S. Cl.
CPC ........ *G01R 23/167* (2013.01); *G01R 29/26* (2013.01); *G01R 31/2822* (2013.01); *G01R 31/2837* (2013.01); *G01R 31/2841* (2013.01); *G01R 31/2853* (2013.01); *G06F 17/12* (2013.01)

(58) Field of Classification Search
CPC .. G01R 23/167; G01R 29/26; G01R 31/2822; G01R 31/2837; G01R 31/2841; G01R 31/2853; G06F 17/12
See application file for complete search history.

(56) References Cited

U.S. PATENT DOCUMENTS

| | | | |
|---|---|---|---|
| 5,168,457 A | * | 12/1992 | Karen .................... G01B 7/004 505/842 |
| 6,639,393 B2 | | 10/2003 | Tasker et al. |
| 6,819,744 B1 | | 11/2004 | Banwell et al. |
| 7,010,441 B2 | | 3/2006 | Galli et al. |
| 7,013,229 B2 | | 3/2006 | Wong et al. |

(Continued)

FOREIGN PATENT DOCUMENTS

| | | | |
|---|---|---|---|
| EP | 3051709 A1 | | 8/2016 |
| JP | 2006244325 | * | 9/2006 |
| WO | 2015090478 | | 6/2015 |

OTHER PUBLICATIONS

LeCroy, "Compensating for Imperfect Receiver Terminations Using the VirtualProbe@Receiver Math Operation to Eliminate Reflections", 2012.*

(Continued)

*Primary Examiner* — Catherine T. Rastovski
(74) *Attorney, Agent, or Firm* — Zilka-Kotab, P.C.

(57) ABSTRACT

Embodiments of the present invention reconstruct a waveform at a receiver-end of a channel from an observed waveform physically measured at a probe point near the middle of the channel, where the channel is corrupted by reflections. The channel may be a memory channel of a high-speed I/O interface, for example. Equations to derive the waveform may be created using linear network analysis and/or signal processing, for example. S-parameters may be derived from simulated models representing components from the probe point to the load. The s-parameters together with the load impedance are used to recreate the desired waveform free from corruption due to reflections.

14 Claims, 18 Drawing Sheets

(56) References Cited

U.S. PATENT DOCUMENTS

| | | | |
|---|---|---|---|
| 7,034,629 B2 | 4/2006 | Tsironis | |
| 7,089,158 B2 | 8/2006 | Sternberg et al. | |
| 7,439,748 B2 | 10/2008 | Kamitani | |
| 7,693,691 B1* | 4/2010 | Tao | G06F 17/5009 |
| | | | 375/267 |
| 7,865,319 B1 | 1/2011 | Jacobs et al. | |
| 8,786,293 B1 | 7/2014 | Tsironis | |
| 8,810,257 B2 | 8/2014 | Simpson | |
| 9,086,376 B1 | 7/2015 | Dunsmore et al. | |
| 9,928,318 B1* | 3/2018 | Kukal | G06F 30/33 |
| 2008/0059092 A1* | 3/2008 | Pupalaikis | H04L 43/50 |
| | | | 702/66 |
| 2009/0125279 A1 | 5/2009 | Fakterman | |
| 2011/0199107 A1 | 8/2011 | Adamian et al. | |
| 2013/0080106 A1* | 3/2013 | Carlson | G01R 31/2841 |
| | | | 702/104 |
| 2013/0332101 A1 | 12/2013 | Pickerd et al. | |
| 2015/0084656 A1 | 3/2015 | Pickerd et al. | |
| 2019/0021163 A1* | 1/2019 | Shelsky | H01L 25/18 |

OTHER PUBLICATIONS

LeCroy, "Compensating for Imperfect Receiver Terminations: Using the VirtualProbe@Receiver Math Operation to Eliminate Reflections", Apr. 27, 2012, Lab Brief WM789.

Sutono, Teledyne LeCroy Protocol Solutions Group, "Guidelines for Using Teledyne LeCroy PCI Express Gen3 Multi-lead Probe", Sep. 11, 2014.

Teledyne LeCroy, "EYEDR-VP", Link: http://teledynelecroy.com/options/productdetails.aspx?modelid=1482&categoryid=12&groupid=103, Downloaded Jan. 17, 2018.

Nelson, "High-speed-digital test targets physical layer", Evaluation Engineering, Jan. 1, 2015.

LeCroy, "Teledyne LeCroy Announces DDR4 Physical Layer Compliance Test Support and DDR4 Lighthouse Partners Program", Chestnut Ridge, NY, Apr. 25, 2013.

Keysight Technologies, "PAM-4 Simulation to Measurement Validation with Commercially Available Software and Hardware", published at DesignCon in Jan. 2016.

Keysight Technologies, "Fast-Tracking Deployment in PAM-4 Applications with Commercially-Available Software and Hardware Tools", Jul. 6, 2016, link: https://www.signalintegrityjournal.com/articles/14-fast-tracking-deployment-in-pam-4-applications-with-commercially-available-software-and-hardware-tools.

Keysight Technologies, "Keysight Technologies Using De-embedding Tools for Virtual Probing", Published in USA, Aug. 2, 2014.

Erickson, Nicholas Garrett, "An evaluation of de-embedding techniques for TSVs" (2013).Masters Theses. 7196. http://scholarsmine.mst.edu/masters_theses/7196.

LeCroy, "SDAIII—CompleteLinQ Multi-Lane Serial Data, Noise and Crosstalk Analysis: Eyedoctor II and Virtualprobe Signal Integrity Tools," LeCroy Corporation, 2012, pp. 1-12, retrieved from http://static6.arrow.com/aropdfconversion/560e5d697da1f65292c45740e97c187f5f7d03c5/lecroy_sdaiii_linq_datasheet.pdf.

Anritsu, "Embedding/De-embedding," Anritsu Application Note, Rev: B, May 2002, pp. 1-16, retrieved from https://dl.cdn-anritsu.com/en-us/test-measurement/files/Application-Notes/Application-Note/11410-00278B.pdf.

* cited by examiner $$y_{rx} = \beta_3 + \alpha_3$$
$$y_{rx} = \beta_3 + \Gamma_L \beta_3$$
$$y_{rx} = \beta_3(1 + \Gamma_L)$$

$$= \frac{y_{obs}(1+\Gamma_L)}{\left(\frac{(1-S_{22}^B\Gamma_L)(S_{11}^B+1)}{S_{21}^B}+S_{12}^B\Gamma_L\right)}$$

RX Waveform as a function of measurement $$\beta_3 = S_{21}^B \beta_2 + S_{22}^B \alpha_3$$
$$\beta_3 = S_{21}^B \beta_2 + S_{22}^B \Gamma_L \beta_3$$
$$\beta_3(1 - S_{22}^B \Gamma_L) = S_{21}^B \beta_2$$
$$\beta_2 = \frac{\beta_3(1 - S_{22}^B \Gamma_L)}{S_{21}^B}$$

$$y_{obs} = \beta_2 + \alpha_2$$
$$= \beta_2 + S_{11}^B \beta_2 + S_{12}^B \alpha_3$$
$$= (S_{11}^B + 1)\beta_2 + S_{12}^B \Gamma_L \beta_3$$
$$= \frac{\beta_3(1-S_{22}^B\Gamma_L)(S_{11}^B+1)}{S_{21}^B} + S_{12}^B \Gamma_L \beta_3$$
$$= \beta_3\left(\frac{(1-S_{22}^B\Gamma_L)(S_{11}^B+1)}{S_{21}^B} + S_{12}^B \Gamma_L\right)$$
$$\beta_3 = \frac{y_{obs}}{\left(\frac{(1-S_{22}^B\Gamma_L)(S_{11}^B+1)}{S_{21}^B} + S_{12}^B \Gamma_L\right)}$$

Table 1

FIG. 4B

SYSTEMATIC METHODOLOGY TO REMOVE REFLECTIONS FROM I/O MEASUREMENTS

FIELD

Embodiments of the present invention generally relate to the field of high-speed I/O design. More specifically, embodiments of the present invention relate to systems and methods for determining a characteristics of waveform at the end of a high-speed I/O channel, where the measurements may be corrupted by reflections.

BACKGROUND

There is a common need in the field of high-speed I/O design to derive or measure a waveform at a receiver-end of a channel where the measurement point can be corrupted by reflections. Some existing methods for determining the waveform of a channel use de-embedding to mathematically remove one or more components from the channel in order to measure at the receiver-end of the channel, where the channel is uncorrupted by reflections. However, in many cases, there is no probe point accessible for physically probing near the receiver-end of the channel because physical access to the receiver-end is not available.

When probing near the middle of the channel to determine the waveform at the receiver-end of the channel, reflections must be accounted for. What is needed is a technique that accounts for channel reflection to derive or measure a waveform at the receiver-end of a channel based on physical measurements observed near the middle of the channel, or along an arbitrary point that is not on the receiver-end.

SUMMARY

A method and apparatus for reconstructing a waveform at a receiver-end of a channel from an observed waveform physically measured at a probe point near the middle of the channel are disclosed herein. The channel is corrupted or otherwise influenced by reflections there along and may be a memory channel of a high-speed I/O interface, for example. A filtered function or other equation is used to derive the waveform may be created using linear network analysis and/or signal processing, for example. S-parameters may be derived from simulated models representing components from the probe point to the load in an ideal transmission line environment. The s-parameters together with the load impedance and the measured waveform are used to recreate the desired waveform at the receiver-end free from corruption due to reflections. According to some embodiments, a signal flow diagram is automatically created and used to derive equations for calculating the Rx waveform.

According to one embodiment, a computer controlled method of determining a waveform at a receiver-end of a channel is disclosed. The method includes measuring an observed waveform at a probe point of the channel, where the probe point is located between a source and a receiver, where a first component and a second component are located between the source and the receiver, the probe point is located between the first component and the second component, and the observed waveform is corrupted by reflections, generating a first channel model representing the first component and a second channel model representing the second component, and calculating the waveform at the receiver-end of the channel based on the observed waveform, the first and second channel models, and a load impedance of the channel, where the waveform as calculated is uncorrupted by reflections.

According to another embodiment, an apparatus for determining a waveform at a receiver-end of a channel is disclosed. The apparatus includes a memory operable to store a plurality of communication channel models, and a processor communicatively coupled to the memory, where the processor is configured to perform a method of determining a waveform at a receiver-end of a channel. The method includes measuring an observed waveform at a probe point of the channel, where the probe point is between a source and a receiver, a first component and a second component are between the source and the receiver, the probe point is between the first component and the second component, and the observed waveform is corrupted by reflections, generating a first channel model representing the first component and a second channel model representing the second component, where the first channel model and the second channel model are stored in memory, and calculating the waveform at the receiver-end of the channel based on the observed waveform, the first and second channel models, and a load impedance of the channel, where the waveform as calculated is uncorrupted by reflections.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 4B illustrates calculations performed given the s-parameter model from the probe point to the load, and given the load impedance according to embodiments of the present invention.

DETAILED DESCRIPTION

Figure 1:
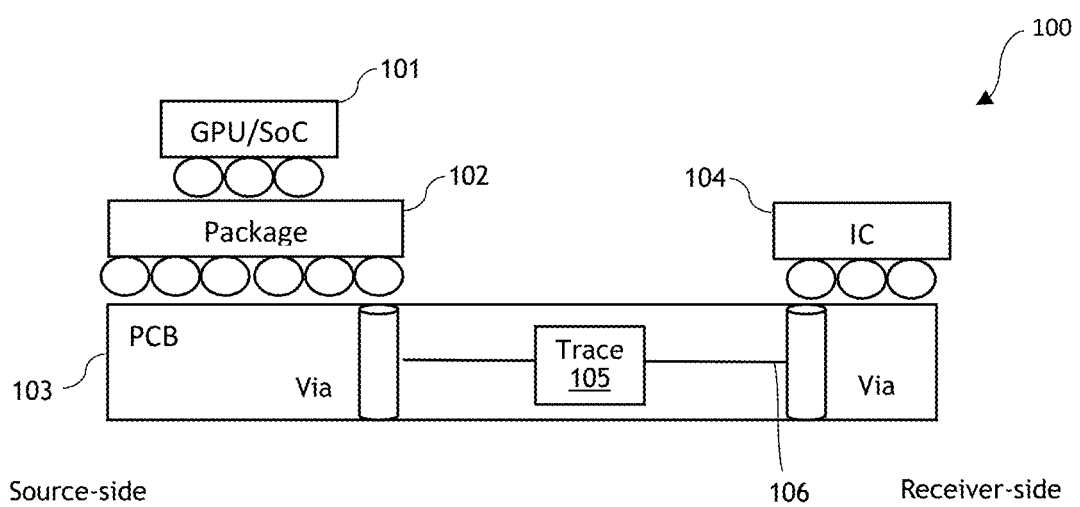
FIG. 1 depicts an exemplary high-speed Input/Output (I/O) circuit according to embodiments of the present invention.

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Portions of the detailed description that follows are presented and discussed in terms of a method. Although steps and sequencing thereof are disclosed in a figure herein (e.g., FIG. 17) describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "traversing," "associating," "deriving," "solving," "determining," "identifying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Systematic Methodology to Remove Reflections from I/O Measurements

A method and apparatus for reconstructing a waveform at a receiver-end of a channel from an observed waveform physically measured at a probe point near the middle of the communication channel are disclosed herein. The channel is corrupted by reflections and may be a memory channel of a high-speed I/O interface, for example. A filtered function or other equation is used to derive the waveform and may be created using linear network analysis and/or signal processing, for example. 5-parameters may be derived from simulated models representing components from the probe point to the load. The s-parameters together with the load impedance are used to advantageously recreate the desired waveform free from corruption due to reflections. According to some embodiments, a signal flow diagram is automatically created and used to derive equations for calculating the Rx waveform.

With regard to FIG. 1, an exemplary high-speed Input/Output (I/O) circuit 100 is depicted according to embodiments of the present invention. The high-speed I/O circuit 100 includes a printed circuit board (PCB) layer 103, a package layer 102, a receiving integrated circuit 104 (a "receiver"), and a driver 101 (e.g., a graphics processing unit (GPU) or a system on a chip (SoC)). The receiving integrated circuit 104 may be a memory unit, such as DDR5 RAM, for example, but it could be any of a number of high speed channels. A signal is transmitted from the source-side (left) to the receiver-side (right) over trace 105. To measure the signal (e.g., measure the signal integrity) and derive the waveform at the integrated circuit 104, a probe is used to physically contact and measure the output at an available probe point 106 near the receiver. Probing near the middle of the channel causes the initial measurements to be degraded by reflections due to characteristics of the channel, as represented by the reflection coefficient F.

Figure 2:
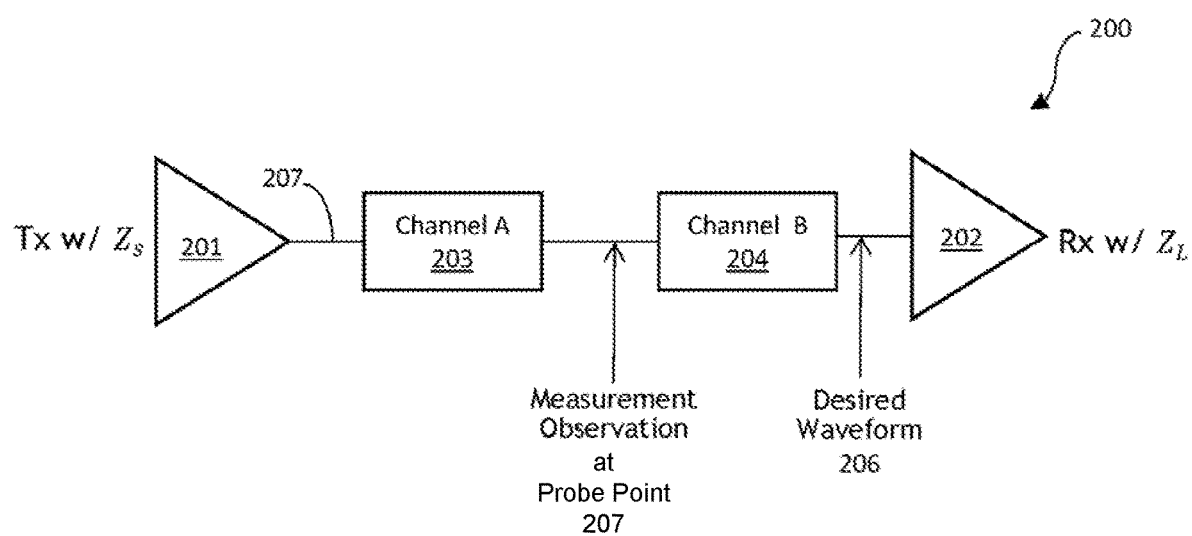
FIG. 2 depicts an exemplary single-load high-speed I/O circuit model computer based simulation according to embodiments of the present invention.
Figure 3A:
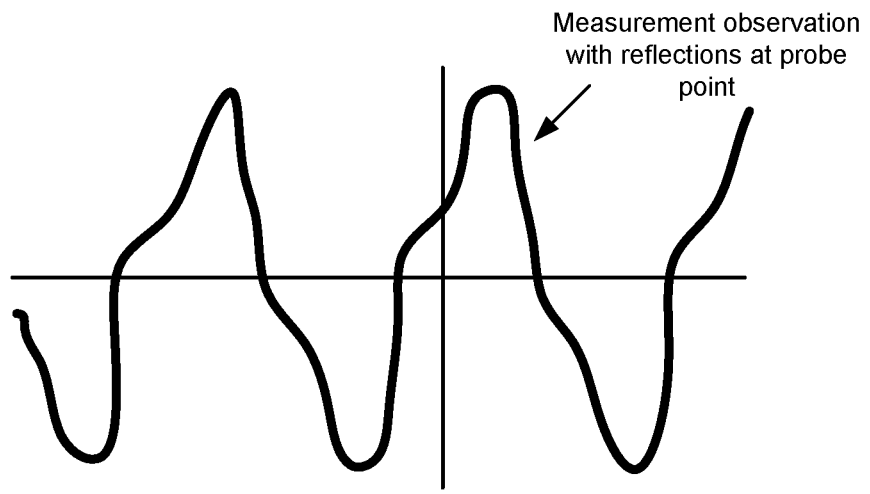
FIG. 3A depicts an exemplary waveform measurement observation $y_{obs}$ measured at a probe point near the middle of a high-speed I/O channel in a transmission line environment according to embodiments of the present invention.
Figure 3B:
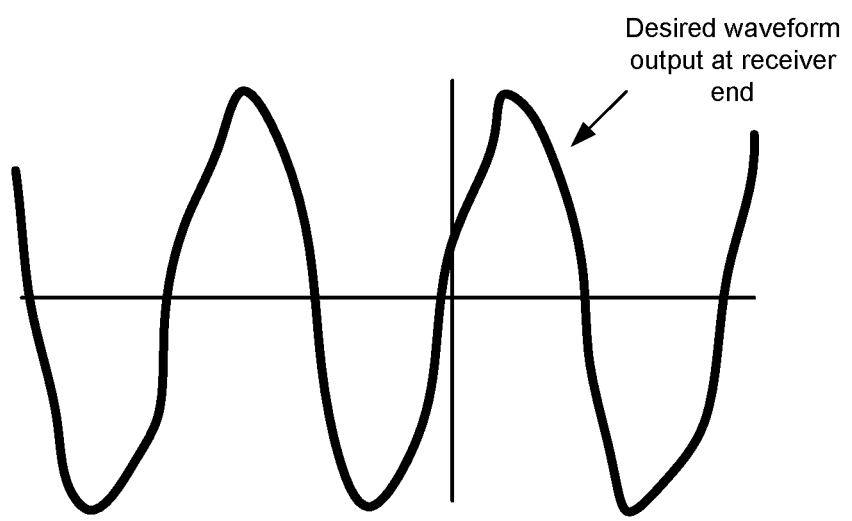
FIG. 3B represents an exemplary reconstructed waveform output at the receiver-end of a channel that has been reconstructed using a computer-implemented method according to embodiments of the present invention.

Removing Reflections from Rx Waveform Measurement of a Single-Load High-Speed I/O Circuit With regard to FIG. 2, an exemplary single-load high-speed I/O circuit 200 is depicted according to embodiments of the present invention. Source 201 sends a signal to receiver 202 over a trace that includes a simulated channel model A 203 between the source to the probe point 207, and simulated channel model B 204 between the probe point and the load (e.g., receiver 202). It is assumed that direct physical measurement at point 206 is not readily available. Given the channel models and the source and load impedance, the desired waveform $y_{rx}$ at the receiver can nevertheless be computed based on the measurement observation $y_{obs}$ as measured at probe point 207 based on embodiments of the present invention. FIG. 3A depicts an exemplary measurement observation $y_{obs}$ as measured at probe point 207 according to embodiments of the present invention. FIG. 3B represents the desired waveform output 206 at the receiver-end as computed according to embodiments of the present invention.

Figure 4A:
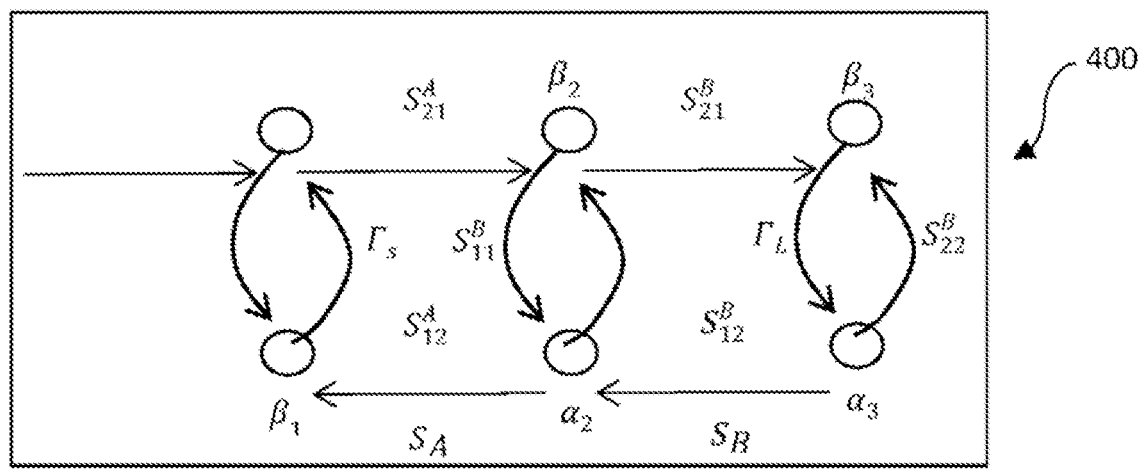
FIG. 4A depicts a signal-flow diagram for representing an exemplary single-load high-speed I/O circuit reduced as a linear systems problem according to embodiments of the present invention.

With regard to FIG. 4A, a signal-flow diagram 400 representing exemplary circuit 200 as a linear systems problem is depicted according to embodiments of the present invention. Values of the signal-flow diagram may be generated using linear network analysis and/or linear signal processing, for example. $S_A$ represents the s-parameters of Channel A from the source to the probe point, $S_B$ represents the s-parameters of Channel B from the probe point to the load, $Z_S$ represents the source impedance, $Z_L$ represents the load impedance, $\Gamma_L$ represents the reflection coefficient at load $$\frac{Z_L - Z_0}{Z_L + Z_0},$$

and $\Gamma_S$ represents the reflection coefficient at source $$\frac{Z_S - Z_0}{Z_S + Z_0}.$$

The signal-flow diagram graphically represents the exemplary circuit 200 as a linear systems problem. The arrows of the signal-flow diagram indicate the direction of electron or current flow. S-parameters for multiple paths linking the same two nodes can be combined into a single path by adding the s-parameters, and s-parameters for paths in series can be combined by multiplying the s-parameters. The desired output of signal-flow diagram 400 can be represented as $\beta_3+\alpha_3$, and the measured output can be represented as $\beta_2+\alpha_2$. The receiver waveform $y_{rx}$ is defined as a filtered function of the measured waveform $y_{obs}$. The calculations included in Table I of FIG. 4B are performed given the s-parameter model from the probe point to the load, and given the load impedance. These calculations may be performed using a computer. According to some embodiments, computer calculations to derive the Rx waveform do not require source impedance values or a channel model characterizing the channel from the source to the probe point.

A computer-implemented matrix manipulation tool, such as MATLAB, can be used to solve the systems of equations using an augmented matrix in reduced echelon form. Any well-known computer simulation package can be used. The desired Rx waveform as a function of measurement for signal-flow diagram 400 is computed as:

$$y_{rx} = \frac{y_{obs}(1 + \Gamma_L)}{\left(\frac{(1 - S_{22}^B \Gamma_L)(S_{11}^B + 1)}{S_{21}^B} + S_{12}^B \Gamma_L\right)}$$

Figure 5:
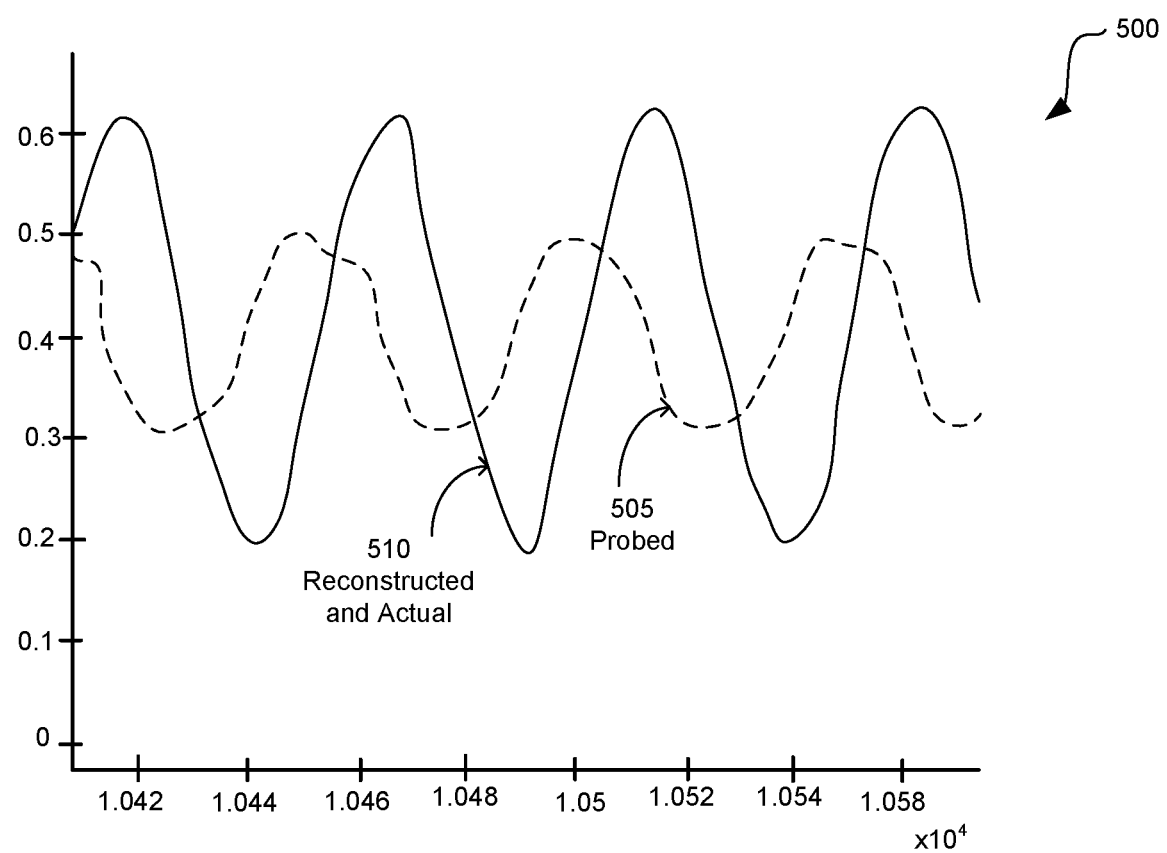
FIG. 5 is a graph charting exemplary results of a probed Rx waveform, an actual Rx waveform, and an Rx waveform reconstructed using a computer-implemented method according to embodiments of the present invention.

With regard to FIG. 5, a graph 500 charting exemplary results of a probed Rx Waveform 505, an Rx waveform reconstructed using a computer-implemented method according to teachings of the present invention 510, and an actual Rx waveform 510, is depicted according to embodiments of the present invention. The reconstructed Rx waveform 510 is derived from a computer implemented simulation using a package-printed circuit board model (PKG+PCB) for Channel A, and a DRAM model for Channel B of exemplary high-speed I/O circuit 200. As depicted, the Rx waveform 510 reconstructed by the computer-implemented method is nearly identical to the simulation result, with less than a 0.5 mV mean squared error for the waveform reconstructed using the computer-implemented method. This equates to a less than 1% error rate.

Figure 6:
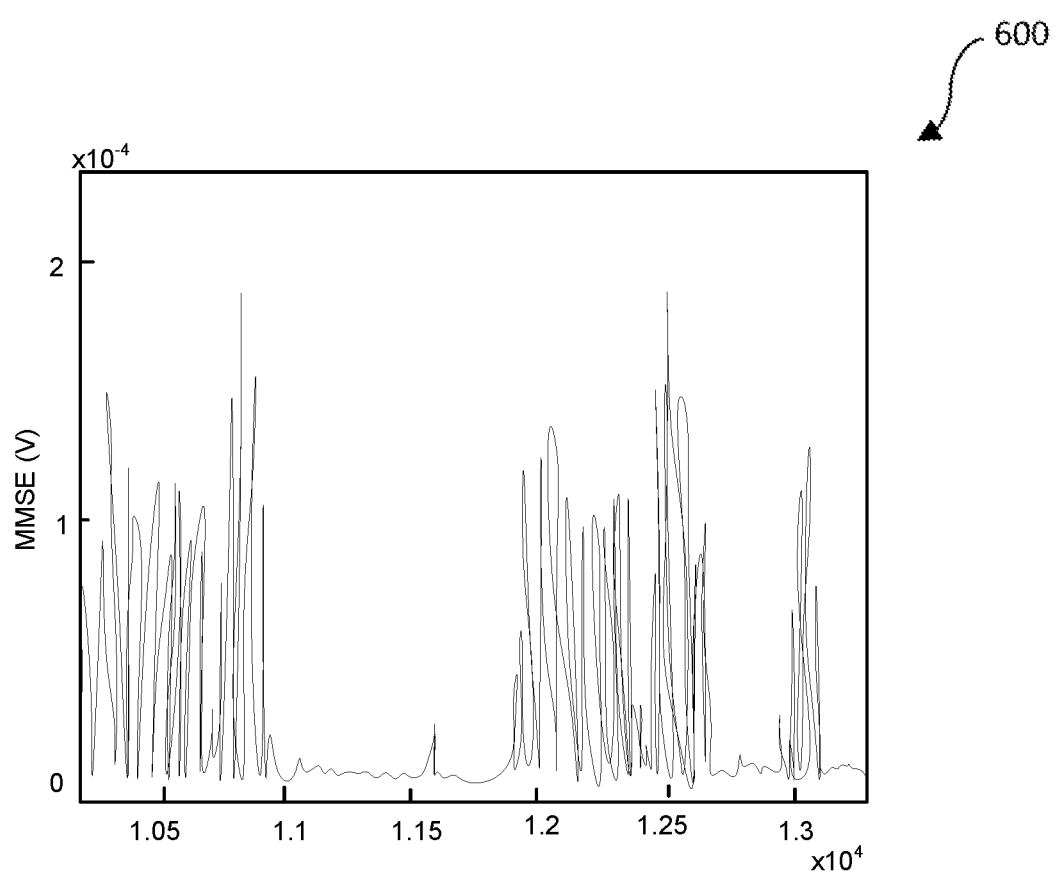
FIG. 6 is a graph charting a mean squared error of an actual Rx waveform compared to an Rx waveform reconstructed according to embodiments of the present invention, where the mean squared error is less than 0.5 mV.

With regard to FIG. 6, a graph 600 charting a mean squared error of the reconstructed Rx waveform compared to the actual Rx waveform is depicted according to embodiments of the present invention. As depicted in FIG. 6, the mean squared error is less than 0.5 mV.

Figure 7:
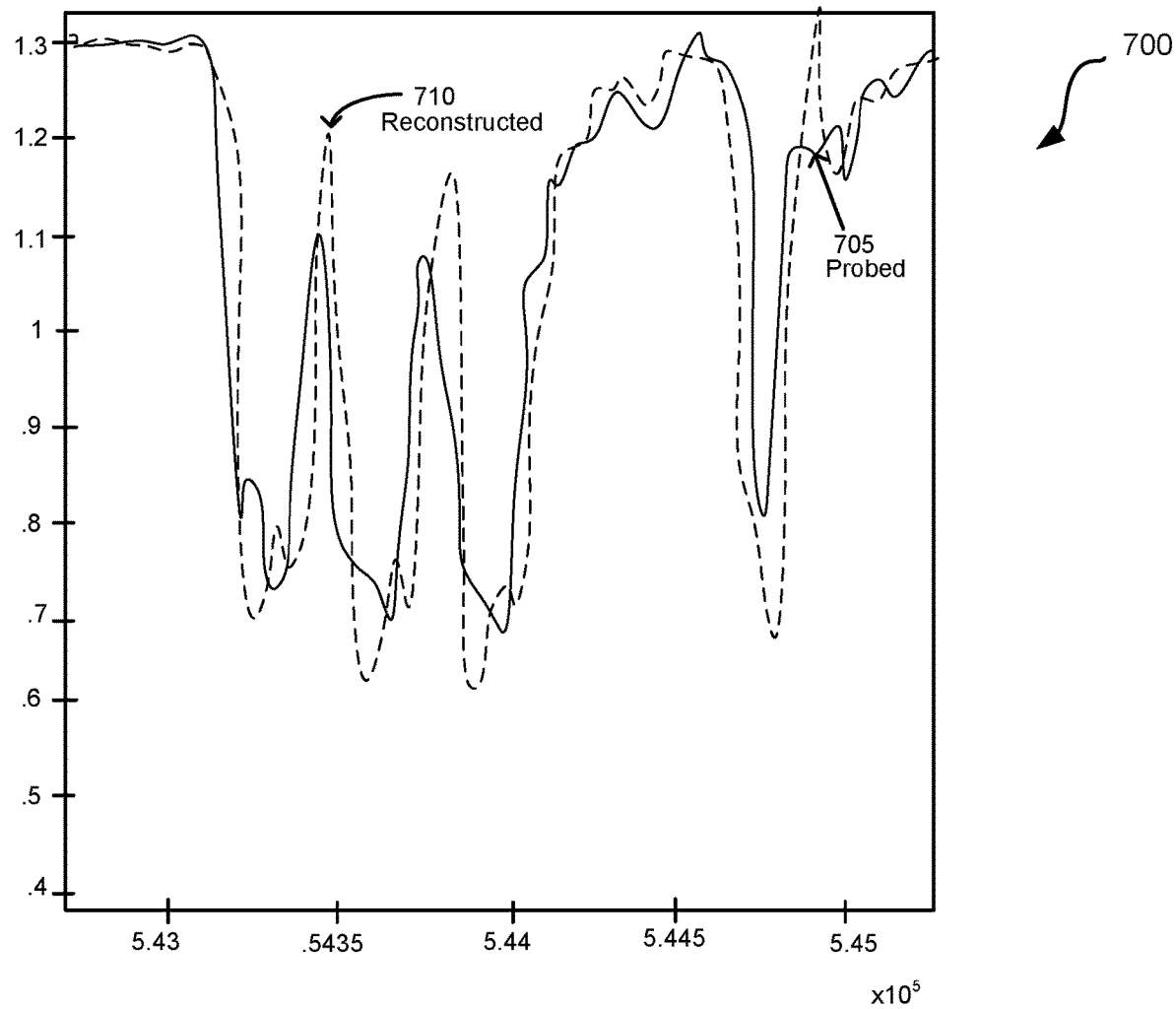
FIG. 7 is a graph depicting a measured Rx waveform and an Rx waveform reconstructed according to embodiments of the present invention, where the reflections of the measured Rx x waveform are indicated by the differences between the measured Rx waveform and the reconstructed Rx waveform.

With regard to FIG. 7, a graph 700 depicting reflections of a measured Rx waveform 705 is depicted according to embodiments of the present invention. The measured Rx waveform 705 represents measured lab data from a GDDR5X™ chip. Reflections corrupting waveform 705 are indicated by the differences between the reconstructed Rx waveform 710 and the measured Rx waveform 705.

Figure 8A:
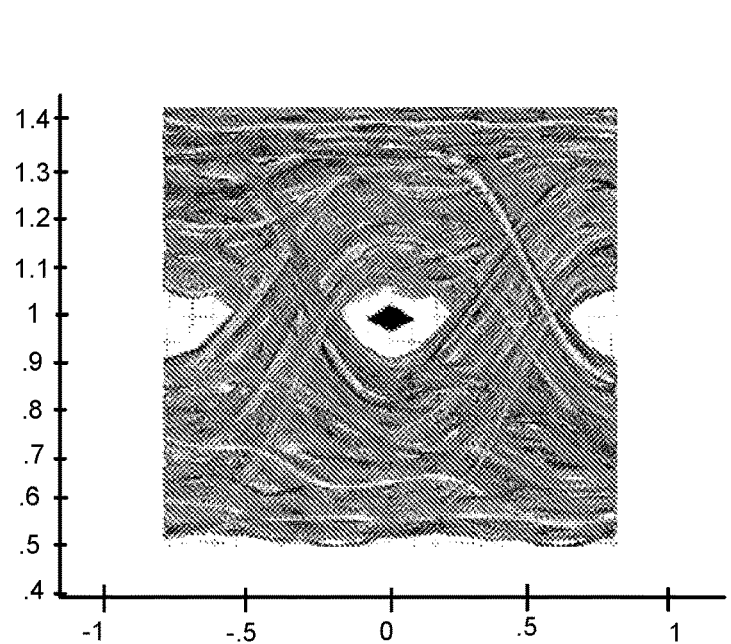
FIG. 8A depicts an eye-diagram of exemplary measured signal data, where the signal is corrupted by reflections, according to embodiments of the present invention.
Figure 8B:
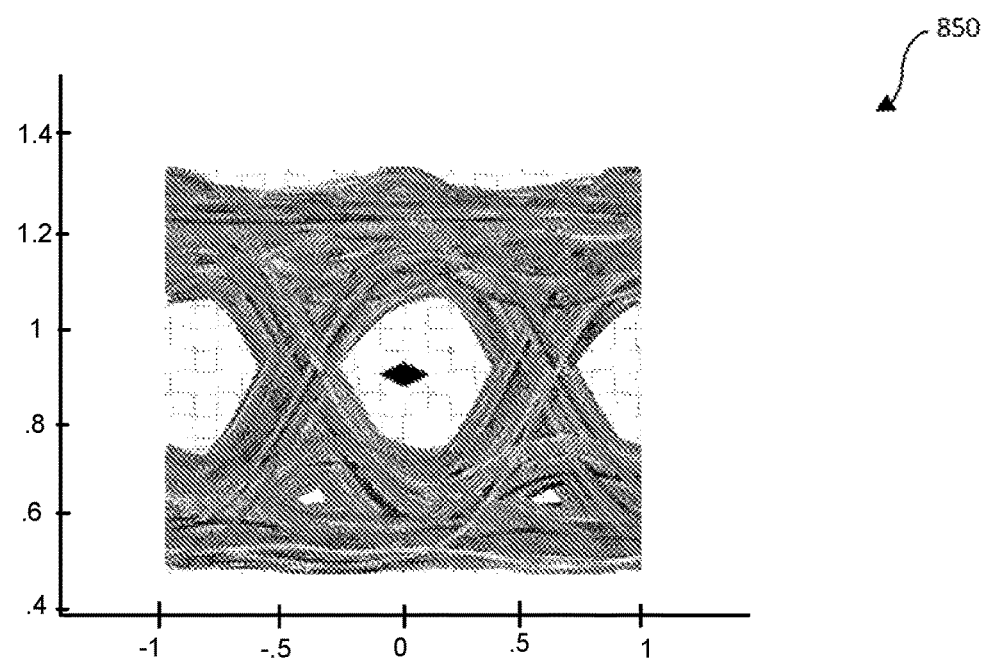
FIG. 8B depicts an eye-diagram of an exemplary signal reconstructed using computer-implemented methods to remove reflections according to embodiments of the present invention.

FIG. 8A charts an eye-diagram 800 of an exemplary signal based on measured data. An eye-diagram is a graphical representation of a digital signal, where a device (e.g., a computer system or oscilloscope) generates the eye-diagram by overlaying sweeps of different segments of a data stream driven by a master clock. As depicted in eye-diagram 800, the measured Rx waveform is corrupted by reflections. FIG. 8B depicts an eye-diagram 850 for an exemplary digital signal reconstructed using computer-implemented teachings of the present invention. Specifically, the eye-diagram 850 of FIG. 8B is reconstructed using a DRAM channel model and load impedance, and the depicted signal is uncorrupted by reflections.

Figure 9:
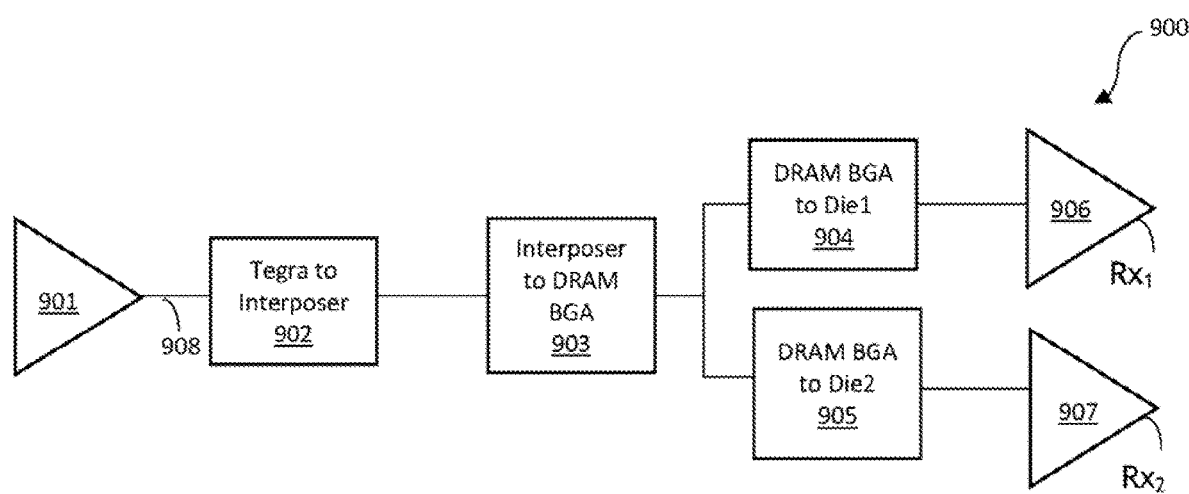
FIG. 9 depicts an exemplary block diagram of a double-load circuit in a transmission line environment is according to embodiments of the present invention.

Removing Reflections from Rx Waveform Measurement of a Double-Load High-Speed I/O Circuit With regard to FIG. 9, an exemplary double-load high-speed I/O circuit 900 depicted according to embodiments of the present invention. Source 901 sends a signal to receivers 906 and 907 over a trace 908 that includes a Tegra-to-Interposer 902 and an Interposer-to-DRAM ball grid array (BGA) 903. The trace branches and includes DRAM BGA to Die1 904 and DRAM BGA to Die2 905. The DRAM BGAs 904 and 905 are communicatively coupled to a receiver $Rx_1$ 906 or RX2 907, respectively.

Figure 10:
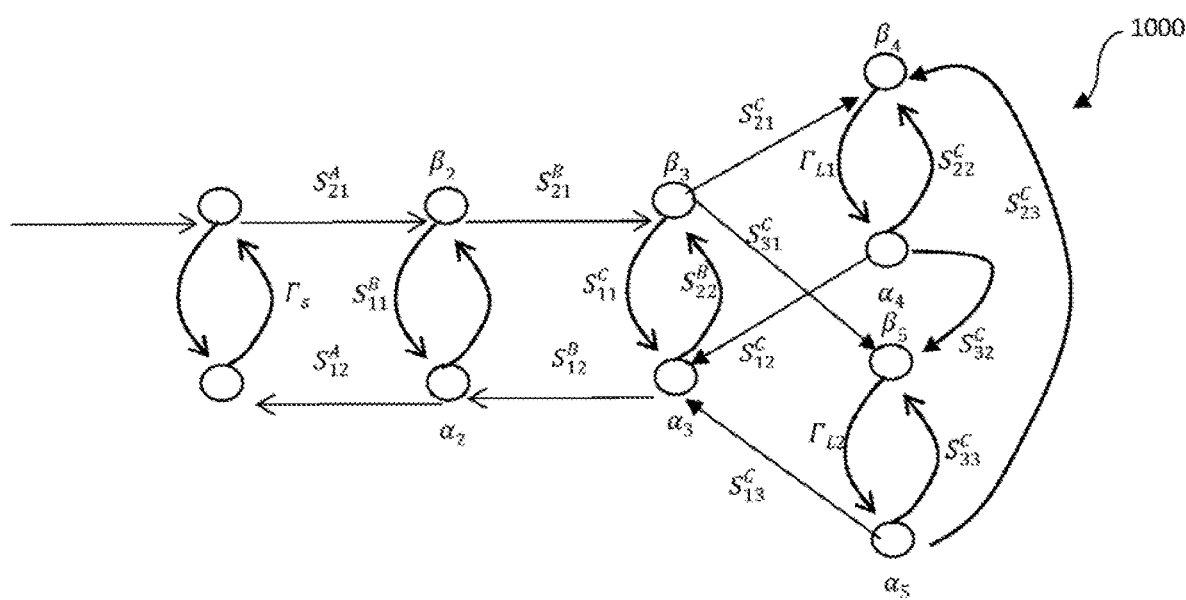
FIG. 10 depicts an exemplary signal-flow diagram for a double-load circuit according to embodiments of the present invention.
Figure 11:
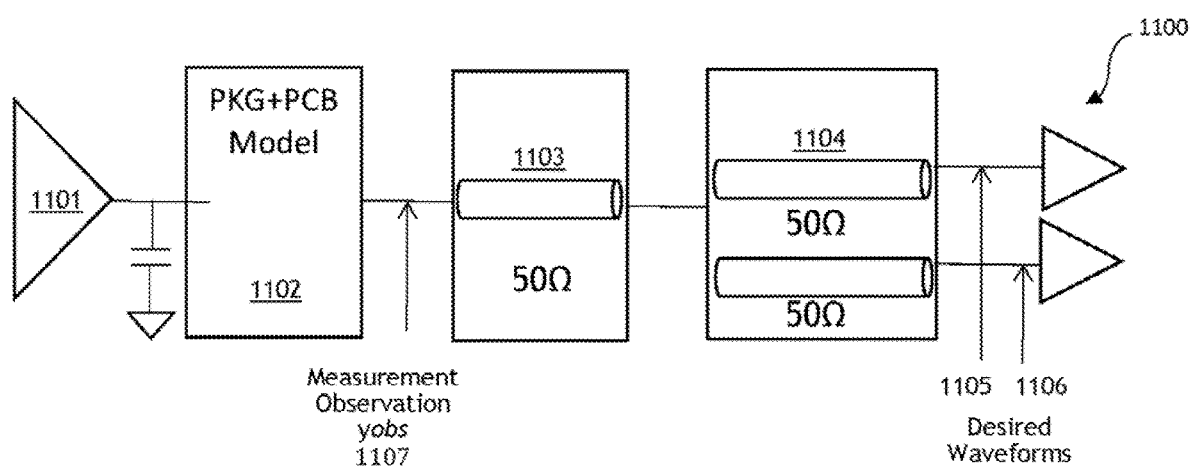
FIG. 11 depicts an exemplary double-load high-speed I/O circuit design simulation using channel models in an ideal transmission line environment according to embodiments of the present invention.

FIG. 10 depicts an exemplary signal-flow diagram 1000 for a double-load high-speed I/O circuit such as the exemplary high-speed I/O circuit 900 depicted in FIG. 9. Deriving the desired Rx waveform for a double-load high-speed I/O circuit involves a greater number of equations than the single-load case. FIG. 11 depicts an exemplary simulated circuit design 1100 for a double-load circuit using channel models 1102, 1103, and 1104 from the probe point to the Rx loads in an ideal transmission line environment. Desired Rx waveforms 1105 and 1106 can be derived using the equations of Table II. PKG+PCB Model 1102, channel model 1103, and channel model 1104 are used to characterize the channel. Channel model 1103 represents a 50Ω component, and channel model 1104 represents two 50Ω components in parallel.

Table II includes equations representing the signals and nodes of the signal-flow diagram 1000 used to perform a computer-implemented method for reconstructing the desired Rx waveforms from an observable measurement $y_{obs}$ taken at a probe point 1107 near the middle of the channel.

TABLE II

| Equations for Signals | Equations for Nodes |
| --- | --- |
| $y_{rx1} = \beta_4 + \alpha_4$ | $\alpha_2 = S_{11}^B \beta_2 + S_{12}^B \alpha_3$ |
| $y_{rx2} = \beta_5 + \alpha_5$ | $\alpha_3 = S_{11}^C \beta_3 + S_{12}^C \beta_4 + S_{13}^C \beta_5$ |
| $y_{mea} = \beta_4 + \alpha_4$ | $\beta_3 = S_{21}^B \beta_2 + S_{22}^B \alpha_3$ |
| | $\alpha_4 = \Gamma_{L1} \beta_4$ |
| | $\beta_4 = S_{21}^C \beta_3 + S_{22}^C \alpha_4 + S_{23}^C \alpha_5$ |
| | $\alpha_5 = \Gamma_{L2} \beta_5$ |

A computer-implemented matrix manipulation tool, such as MATLAB, may be used to solve the systems of equations. For example, some embodiments use linear algebra to solve the systems of equations using an augmented matrix in reduced echelon form (rref). In the equations, the measured waveform is represented as $y_{mea}$, and the desired waveforms are $y_{rx1}$ and $y_{rx2}$. The final output is derived by computing ifft(FFT(Yprobe)*Hy1/$H_{meas}$). Table III includes an exemplary augmented matrix A. $H_{mea}$ and Hy1 and Hy2 values are computed using rref(A). Please note that the set of values listed for $H_{mea}$ are only a sample of a larger set of values.

Figure 12:
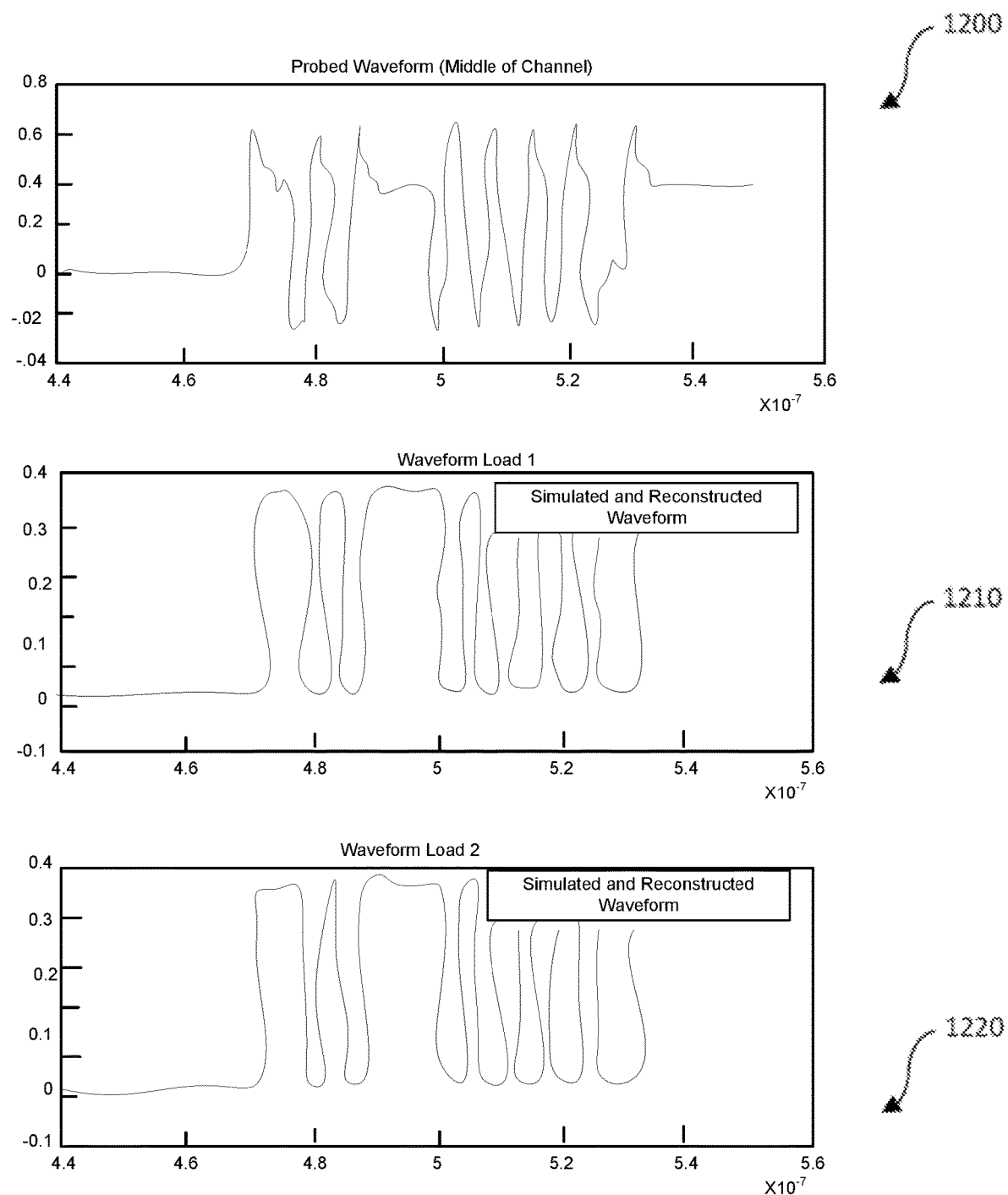
FIG. 12 depicts a series of graphs charting waveforms of an exemplary double-load high-speed I/O circuit, a including measured waveform, a simulated waveform, and a waveform reconstructed using computer-implemented methods according to embodiments of the present invention.

With regard to FIG. 12, a series of graphs depicting measured, reconstructed, and simulated waveforms of an exemplary double-load high-speed I/O circuit are depicted according to embodiments of the present invention. Graph 1200 depicts an exemplary waveform probed at the middle of a channel (e.g., probe point 1107) corrupted by reflections. Graph 1210 depicts both a simulate waveform at a first load (load 1), and a waveform reconstructed using computer-implemented teachings of the present invention based on the measurement taken at the probe point (1200). Because the reconstructed waveform is nearly identical to the simulated waveform, there are no visible differences between the waveforms depicted in graph 1210. Graph 1220 depicts both a simulate waveform at a second load (load 2), and a waveform reconstructed using teachings of the present invention based on the measurement at the probe point (1200). Similar to graph 1210, the reconstructed waveform is nearly identical to the simulated waveform, and there are no visible differences between the waveforms depicted in graph 1220.

Figure 13:
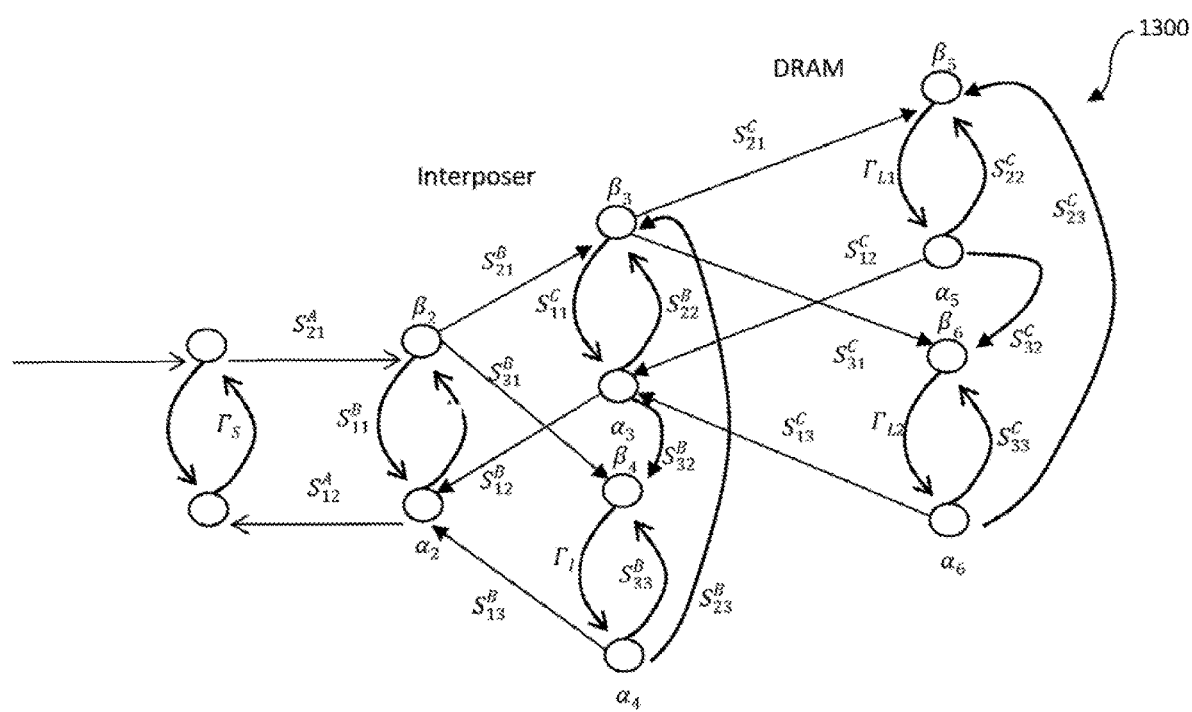
FIG. 13 depicts an exemplary signal-flow diagram for a triple-load high-speed I/O circuit according to embodiments of the present invention.
Figure 14:
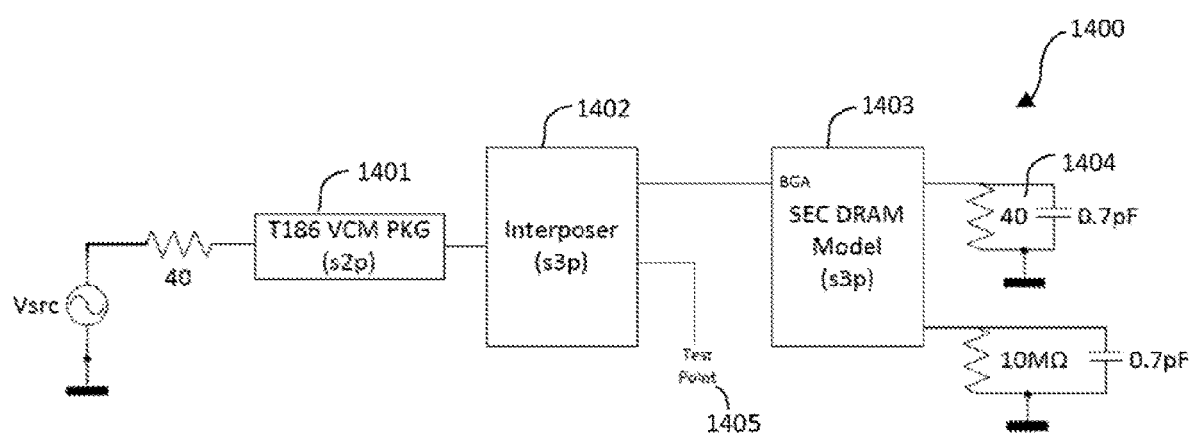
FIG. 14 depicts components of an exemplary triple-load high-speed I/O circuit, including a Tegra X2 T186 system-on-a-chip (SoC), an interposer, and dynamic random-access memory (DRAM) according to embodiments of the present invention.

Removing Reflections from Rx Waveform Measurement of a Triple-Load High-Speed I/O Circuit With regard to FIG. 13, a signal-flow diagram 1300 representing the nodes and signal-flow of an exemplary triple-load high-speed I/O circuit is depicted according to embodiments of the present invention. FIG. 14 depicts components of the exemplary triple-load circuit represented by the signal-flow diagram 1400, including a TEGRA X2 T186™ system-on-a-chip (SoC) 1401, an interposer 1402, and DRAM 1403, according to embodiments of the present invention. Signal-flow diagram 1300 is used to derive equations for recreating the desired Rx waveforms using an observable measurement $y_{mea}$ as measured at a probe point (e.g., test point 1405) near the middle of a channel. Table IV includes equations for performing a computer-implemented method of computing the desired Rx waveform based on a waveform measured near the middle of the channel.

TABLE IV

| Equations for Signals | Equations for Nodes |
| --- | --- |
| $y_{rx1} = \beta_5 + \alpha_5$ | $\alpha_3 = S_{11}^B \beta_2 + S_{12}^B \alpha_3 + S_{13}^B \alpha_4$ |
| $y_{rx2} = \beta_6 + \alpha_6$ | $\alpha_3 = S_{11}^C \beta_3 + S_{12}^C \alpha_5 + S_{13}^C \alpha_6$ |

TABLE III

Hmea = (S11.*S22i − S11i + S22.*gl1 + S33.*gl2 + S11.*S11i.*S22i − S11.*S12i.*S21i + S22.*S11i.*gl1 + S33.*S11i.*gl2 − S11.*S22.*S22i.*gl1 + . . .
S12.*S21.*S22i.*gl1 − S11.*S33.*S22i.*gl2 + S13.*S31.*S22i.*gl2 − S22.*S33.*gl1.*gl2 + S23.*S32.*gl1.*gl2 − S11.*S22.*S11i.*S22i.*gl1 + . . .
S11.*S22.*S12i.*S21i.*gl1 + S12.*S21.*S11i.*S22i.*gl1 − S12.*S21.*S12i.*S21i.*gl1 − S11.*S33.*S11i.*S22i.*gl2 + S11.*S33.*S12i.*S21i.*gl2 + . . .
S13.*S31.*S11i.*S22i.*gl2 − S13.*S31.*S12i.*S21i.*gl2 − S22.*S33.*S11i.*gl1.*gl2 + S23.*S32.*S11i.*gl1.*gl2 + S11.*S22.*S33.*S22i.*gl1.*gl2 − . . .
S11.*S23.*S32.*S22i.*gl1.*gl2 − S12.*S21.*S33.*S22i.*gl1.*gl2 + S12.*S23.*S31.*S22i.*gl1.*gl2 + S13.*S21.*S32.*S22i.*gl1.*gl2 − . . .
S13.*S22.*S31.*S22i.*gl1.*gl2 + S11.*S22.*S33.*S11i.*S22i.*gl1.*gl2 − S11.*S22.*S33.*S12i.*S21i.*gl1.*gl2 − S11.*S23.*S32.*S11i.*S22i.*gl1.*gl2 + . . .
S11.*S23.*S32.*S12i.*S21i.*gl1.*gl2 − S12.*S21.*S33.*S11i.*S22i.*gl1.*gl2 + S12.*S21.*S33.*S12i.*S21i.*gl1.*gl2 + S12.*S23.*S31.*S11i.*S22i.*gl1.*gl2 − . . .
S12.*S23.*S31.*S12i.*S21i.*gl1.*gl2 + S13.*S21.*S32.*S11i.*S22i.*gl1.*gl2 − S13.*S21.*S32.*S12i.*S21i.*gl1.*gl2 − S13.*S22.*S31.*S11i.*S22i.*gl1.*gl2 + . . .
S13.*S22.*S31.*S12i.*S21i.*gl1.*gl2 − 1)./(S21i.*(gl2 + 1).*(S31 + S21.*S32.*gl1 − S22.*S31.*gl1));
Hy1 = −((gl1 + 1).*(S21 − S21.*S33.*gl2 + S23.*S31.*gl2))./((gl2 + 1).*(S31 + S21.*S32.*gl1 − S22.*S31.*gl1));
Hy2 = −((gl2 + 1).*(S31 + S21.*S32.*gl1 − S22.*S31.*gl1))./((gl1 + 1).*(S21 − S21.*S33.*gl2 + S23.*S31.*gl2));

TABLE IV-continued

| Equations for Signals | Equations for Nodes |
|---|---|
| $y_{mea} = \beta_4 + \alpha_4$ | $\alpha_4 = \Gamma_l \beta_4$ |
|  | $\alpha_5 = \Gamma_{L1} \beta_5$ |
|  | $\alpha_6 = \Gamma_{L2} \beta_6$ |
|  | $\beta_3 = S_{21}{}^B \beta_2 + S_{22}{}^B \alpha_3 + S_{23}{}^B \alpha_4$ |
|  | $\beta_4 = S_{31}{}^B \beta_2 + S_{33}{}^B \alpha_4 + S_{32}{}^B \alpha_3$ |
|  | $\beta_5 = S_{21}{}^C \beta_3 + S_{22}{}^C \alpha_5 + S_{23}{}^C \alpha_6$ |
|  | $\beta_6 = S_{31}{}^C \beta_3 + S_{33}{}^C \alpha_6 + S_{32}{}^C \alpha_5$ |

Using the equations of Table IV, the desired Rx waveforms can be reconstructed from $y_{mea}$ based on s-parameters derived from the channel models.

Figure 15A:
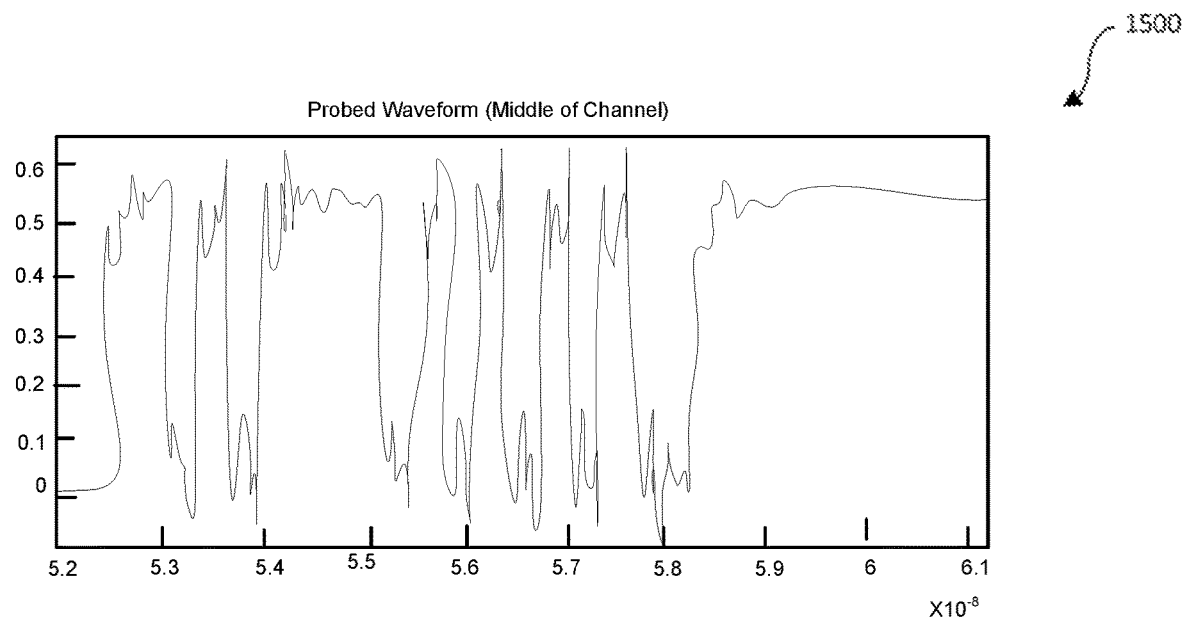
FIG. 15A depicts a graph charting an exemplary waveform measured near a mid-point of a channel of a triple-load circuit according to embodiments of the present invention.
Figure 15B:
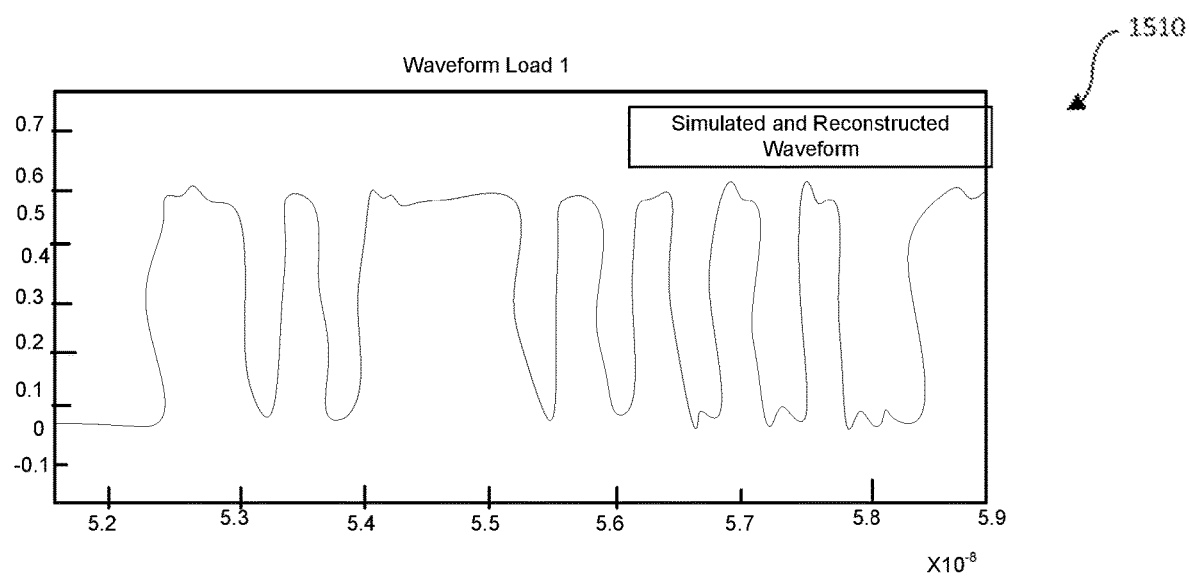
FIG. 15B depicts a graph charting an exemplary waveform reconstructed from the measured waveform of FIG. 15A using a computer-implemented method according to embodiments of the present invention.

With regard to FIG. 15A, a graph 1500 of an exemplary waveform measured near the middle of a channel (e.g., test point) of a triple-load high-speed I/O circuit is depicted according to embodiments of the present invention, where the channel is corrupted by reflections. With regard to FIG. 15B, a graph 1510 of a simulated waveform at load 1404 and an exemplary waveform reconstructed from the measured waveform 1500 of FIG. 15A using a computer-implemented method is depicted according to embodiments of the present invention. As depicted in FIG. 15B, the reconstructed waveform at load 1404 is nearly identical to the simulated waveform at load. Because the reconstructed waveform is nearly identical to the simulated waveform, there are no visible differences between the waveforms depicted in graph 1510.

Embodiments of the present invention are drawn to computer-implemented methods of reconstructing Rx waveforms based on observable waveforms measured at a probe point near the middle of a channel corrupted by reflections. The following discussion describes an exemplary computer system for performing said methods.

Figure 16:
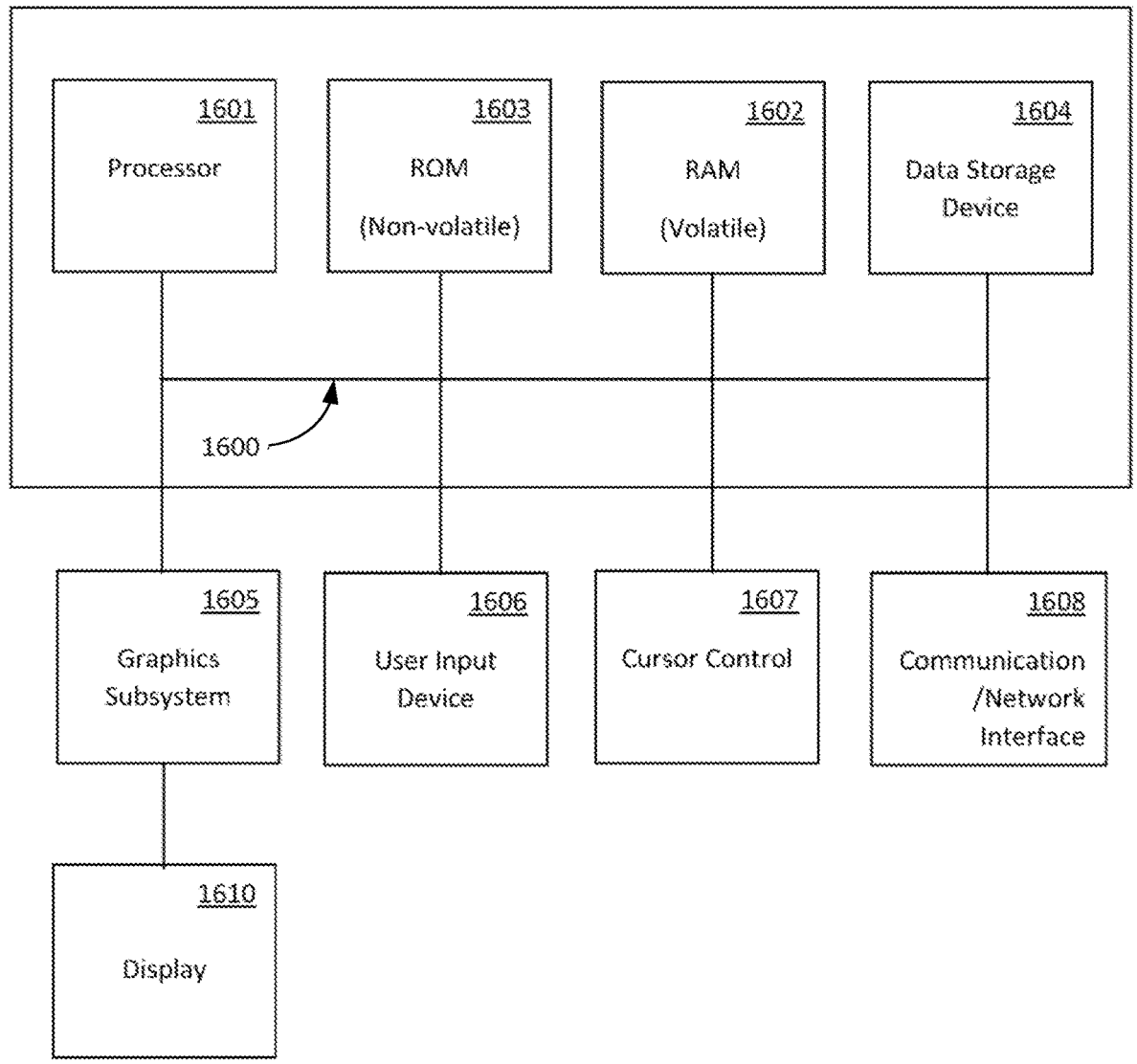
FIG. 16 is a block diagram of an exemplary computer system upon which embodiments of the present invention may be implemented.

In the example of FIG. 16, the exemplary computer system 1612 includes a central processing unit (CPU) 1601 for running software applications and optionally an operating system. Random access memory 1602 and read-only memory 1603 store applications and data for use by the CPU 1601. Data storage device 1604 provides non-volatile storage for applications and data and may include fixed disk drives, removable disk drives, flash memory devices, and CD-ROM, DVD-ROM or other optical storage devices. The optional user input 1606 comprises devices that communicate inputs from one or more users to the computer system 1612 (e.g., mice, joysticks, cameras, touch screens, and/or microphones). The exemplary computer system 1612 further includes cursor control 1607.

In the embodiment of FIG. 16, a graphics subsystem 1605 may be coupled with the data bus 1600 and/or other components of the computer system 1612. The graphics sub-system may comprise a physical graphics processing unit (GPU) and graphics/video memory. The GPU generates pixel data from rendering commands to create output images (e.g., frames). The graphics sub-system 1605 outputs video data to display 1610 and may display video data on a display device 1610 using a connection such as HDMI, DVI, DisplayPort, VGA, etc., or using a wireless communicates protocol, such as Wi-Fi or Miracast. The components of the computer system 1612, including the CPU 1001, memory 1602/1603, data storage 1604, user input devices 1606, and the display device 1610, may be coupled via one or more data buses 1600.

A communication or network interface 1608 allows the computer system 112 to communicate with other computer systems, networks, or devices via an electronic communications network, including wired and/or wireless communication and including an Intranet or the Internet. The network interface 1608 may be used to stream content (e.g., a game) that is rendered by a local or remote device (e.g., a server) and transmitted to the computer system 1612. Graphics and audio data may be received by the computer system 1612 from a server and control, input, and configuration data may be sent from the computer system 1612 to the server.

Figure 17:
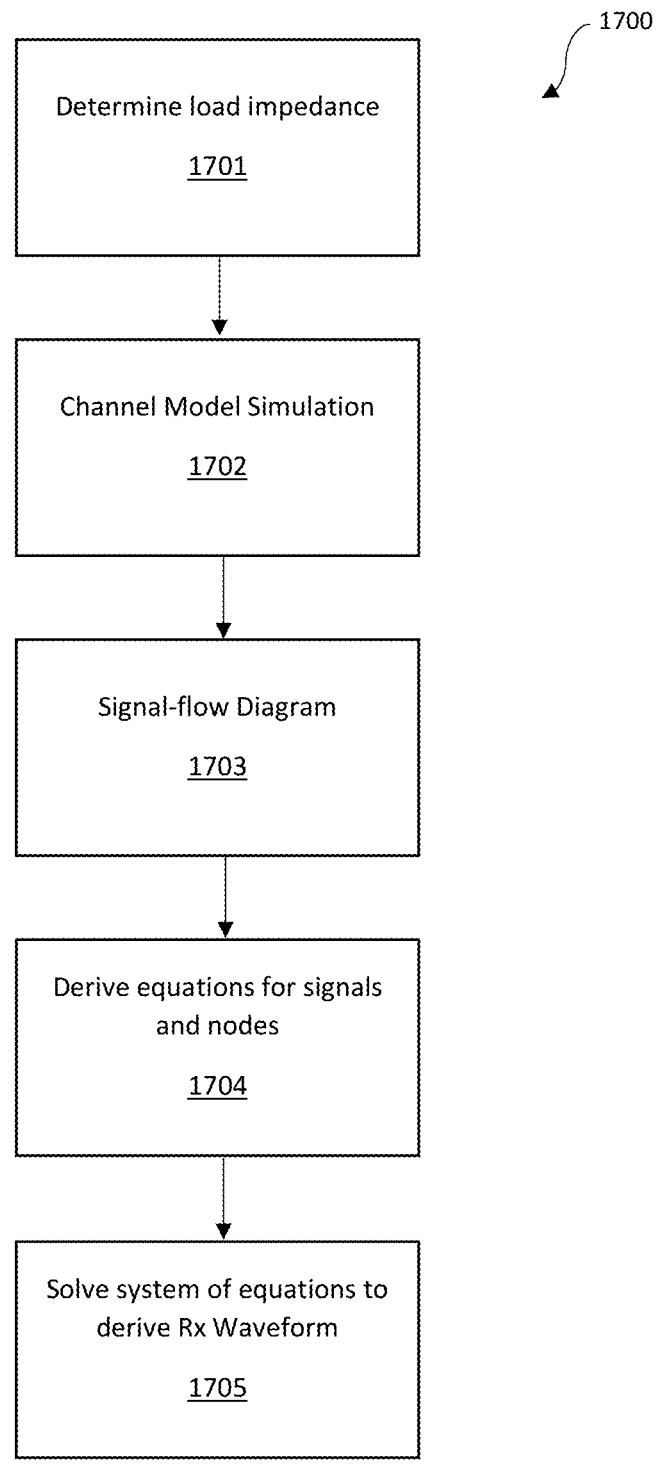
FIG. 17 is a flowchart depicting computer-implemented steps for reconstructing an Rx waveform based on an observable waveform measured at a probe point near the middle of a channel corrupted by reflections according to embodiments of the present invention.

With regard to FIG. 17, a flow chart of a process 1700 of computer-implemented steps for performing a method of reconstructing an Rx waveform based on an observable waveform measured at a probe point near the middle of a channel of a high-speed I/O circuit corrupted by reflections is depicted according to embodiments of the present invention. The process 1700 may be executed on system 1612. At step 1701, a load impedance value for the circuit is determined. This step may involve generating or obtaining a circuit design (e.g., a schematic) that describes the layout of the circuit and/or the components thereof. At step 1702, the channel is characterized using simulated channel models. At step 1703, a signal flow diagram is created. A step 1704, a system of equations for recreating the Rx waveform are derived based on the channel models, using the signal-flow diagram, for example (see Table I-Table IV). At step 1705, the system of equations derived at step 1703 is solved with regard to $y_{rx}$ to reconstruct the desired Rx waveform, where the reconstructed Rx waveform is substantially uncorrupted by reflections.

Some embodiments may be described in the general context of computer-executable instructions, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Embodiments of the present invention are thus described. While the present invention has been described in particular embodiments, it should be appreciated that the present invention should not be construed as limited by such embodiments, but rather construed according to the following claims.

What is claimed is:

1. A computer implemented method of determining a resultant waveform at a receiver-end of a channel, said method comprising:

measuring an observed waveform at a probe point of the channel, wherein the probe point is located between a source and a receiver, wherein a first component and a second component are located between the source and the receiver, wherein the probe point is located between the first component and the second component, and wherein the observed waveform is corrupted by reflections;

simulating a first channel model representing the first component and a second channel model representing the second component;

deriving a first set of s-parameters from the source to the probe point, based on the simulated first channel model;

deriving a second set of s-parameters from the probe point to the receiver, based on the simulated second channel model;

calculating the resultant waveform at the receiver-end of the channel that is substantially uncorrupted by said reflections by:

applying a filtered function to the observed waveform, wherein $y_{obs}$ represents the observed waveform, $S_B$ represents the first and second sets of s-parameters from the probe point to the load, $Z_L$ represents the load impedance, and $\Gamma_L$ represents a reflection coefficient at load $$\frac{Z_L - Z_0}{Z_L + Z_0},$$

and wherein the filtered function is represented by the equation:

$$y_{rx} = \frac{y_{obs}(1 + \Gamma_L)}{\left(\frac{(1 - S_{22}^B \Gamma_L)(S_{11}^B + 1)}{S_{21}^B} + S_{12}^B \Gamma_L\right)}.$$

2. A method as described in claim 1, wherein the first and second sets of s-parameters are of a signal-flow representation, and wherein the signal-flow representation represents the resultant waveform as a linear systems problem, and wherein said calculating the resultant waveform at the receiver-end of the channel comprises solving the linear systems problem for the resultant waveform.

3. A method as described in claim 2, wherein said calculating the resultant waveform further comprises using a computer-implemented matrix manipulation software tool to solve a system of equations represented by the signal-flow representation.

4. A method as described in claim 3, wherein said using a computer-implemented matrix manipulation software tool to solve a system of equations represented by the signal-flow representation comprises using an augmented matrix in reduced echelon form.

5. A method as described in claim 1, wherein the first channel model comprises a PKG+PCB model, and the second channel model comprises a DRAM model.

6. An apparatus for determining a resultant waveform at a receiver-end of a communication channel, said apparatus comprising:
a memory operable to store a plurality of channel models; and
a processor communicatively coupled to the memory, wherein the processor is configured to perform a method of determining the resultant waveform at the receiver-end of the communication channel, said method comprising:
measuring an observed waveform at a probe point of the channel, wherein the probe point is between a source and a receiver, wherein a first component and a second component are between the source and the receiver, wherein the probe point is between the first component and the second component, and wherein the observed waveform is corrupted by reflections;
simulating a first channel model representing the first component and a second channel model representing the second component, wherein the first channel model and the second channel model are stored in said memory;
deriving a first set of s-parameters from the source to the probe point, based on the simulated first channel model;

deriving a second set of s-parameters from the probe point to the receiver, based on the simulated second channel model;
calculating the resultant waveform at the receiver-end of the channel that is substantially uncorrupted by said reflections by:
applying a filtered function to the observed waveform,
wherein $y_{obs}$ represents the observed waveform, $S_B$ represents the first and second sets of s-parameters from the probe point to the load, $Z_L$ represents the load impedance, and $\Gamma_L$ represents a reflection coefficient at load $$\frac{Z_L - Z_0}{Z_L + Z_0},$$

and wherein the filtered function is represented by the equation:

$$y_{rx} = \frac{y_{obs}(1 + \Gamma_L)}{\left(\frac{(1 - S_{22}^B \Gamma_L)(S_{11}^B + 1)}{S_{21}^B} + S_{12}^B \Gamma_L\right)}.$$

7. An apparatus as described in claim 6, wherein the first and second sets of s-parameters are of a signal-flow representation, and wherein the signal-flow representation represents the desired waveform as a linear systems problem, and wherein said calculating the resultant waveform at the receiver-end of the channel comprises solving the linear systems problem for the resultant waveform.

8. An apparatus as described in claim 7, wherein said calculating the resultant waveform further comprises using a computer-implemented matrix manipulation software tool to solve a system of equations represented by the signal-flow representation.

9. An apparatus as described in claim 8, wherein said using a computer-implemented matrix manipulation software tool to solve a system of equations represented by the signal-flow representation comprises using an augmented matrix in reduced echelon form.

10. An apparatus as described in claim 6, wherein the first channel model comprises a PKG+PCB model and the second channel model comprises a DRAM model.

11. A non-transitory computer readable medium having computer-readable program code embodied therein for implementing a method of determining a desired waveform at a receiver-end of a channel, said method comprising:
measuring an observed waveform at a probe point of the channel, wherein the probe point is between a source and a receiver, wherein a first component and a second component are between the source and the receiver, wherein the probe point is between the first component and the second component, and wherein the observed waveform is corrupted by reflections;
accessing from memory a simulated first channel model representing the first component and a simulated second channel model representing the second component;

deriving a first set of s-parameters from the source to the probe point, based on the simulated first channel model;

deriving a second set of s-parameters from the probe point to the receiver, based on the simulated second channel model;

calculating the desired waveform at the receiver-end of the channel that is substantially uncorrupted by said reflections by:

applying a filtered function to the observed waveform, wherein $y_{obs}$ represents the observed waveform, $S_B$ represents the first and second sets of s-parameters from the probe point to the load, $Z_L$ represents the load impedance, and $\Gamma_L$ represents a reflection coefficient at load $$\frac{Z_L - Z_0}{Z_L + Z_0},$$

and wherein the filtered function is represented by the equation:

$$y_{rx} = \frac{y_{obs}(1 + \Gamma_L)}{\left(\frac{(1 - S_{22}^B \Gamma_L)(S_{11}^B + 1)}{S_{21}^B} + S_{12}^B \Gamma_L\right)}.$$

12. A non-transitory computer readable medium as described in claim 11, wherein said calculating the waveform at the receiver-end of the channel comprises generating a linear systems problem using the first and second sets of s-parameters and solving the linear systems problem for the waveform.

13. A non-transitory computer readable medium as described in claim 11, wherein the first channel model comprises a PKG+PCB model, and the second channel model comprises a DRAM model.

14. A non-transitory computer readable medium as described in claim 11, wherein the probe point is a test point of an interposer, and wherein the receiver-end of the channel is not readily available for probing.

* * * * *